(12) United States Patent
Kim

(10) Patent No.: US 7,973,328 B2
(45) Date of Patent: Jul. 5, 2011

(54) LIGHT EMITTING DIODE PACKAGE

(75) Inventor: Hyung Kun Kim, Gyunggi-do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 289 days.

(21) Appl. No.: 12/204,095

(22) Filed: Sep. 4, 2008

(65) Prior Publication Data
US 2009/0283785 A1 Nov. 19, 2009

(30) Foreign Application Priority Data
May 19, 2008 (KR) .................. 10-2008-0046279

(51) Int. Cl.
*H01L 33/00* (2010.01)
(52) U.S. Cl. .............. 257/98; 257/99; 257/100; 257/13; 257/E33.067
(58) Field of Classification Search .................... 257/98, 257/99, 100, 13, E33.067, 10
See application file for complete search history.

(56) References Cited

U.S. PATENT DOCUMENTS

| 6,642,652 | B2 | 11/2003 | Collins, III et al. |
| 7,391,153 | B2* | 6/2008 | Suehiro et al. ............... 313/512 |
| 2005/0151147 | A1 | 7/2005 | Izuno et al. |
| 2008/0035942 | A1* | 2/2008 | Kim et al. ................... 257/98 |

FOREIGN PATENT DOCUMENTS
JP 2008-042211 2/2008

OTHER PUBLICATIONS
Korean Office Action, with English translation, issued in Korean Patent Application No. 10-2008-0046279, mailed Feb. 24, 2010.

* cited by examiner

*Primary Examiner* — Thinh T Nguyen
(74) *Attorney, Agent, or Firm* — McDermott Will & Emery LLP

(57) ABSTRACT

There is provided a light emitting diode (LED) package in which a phosphor layer encapsulating an LED chip is formed uniformly to facilitate a process. The LED package includes: a package body having a mounting area; a holding part mounted on the mounting area to expose a portion of the mounting area; an LED chip mounted on the mounting area, the LED chip surrounded by the holding part to emit light; and a phosphor layer held by the holding part to seal a space defined by the holding part, the phosphor layer converting a wavelength of the light from the LED chip.

8 Claims, 3 Drawing Sheets

LIGHT EMITTING DIODE PACKAGE

CROSS-REFERENCE TO RELATED APPLICATIONS

This application claims the priority of Korean Patent Application No. 2008-46279 filed on May 19, 2008, in the Korean Intellectual Property Office, the disclosure of which is incorporated herein by reference.

BACKGROUND OF THE INVENTION

1. Field of the Invention

The present invention relates to a light emitting diode (LED) package, and more particularly, in which a phosphor layer encapsulating an LED chip is formed uniformly to facilitate a process.

2. Description of the Related Art

Recently, a light emitting diode (LED) is utilized as a light source of various colors. Notably, with a greater demand for high-output and high-brightness LEDs such as a white LED for lighting, studies have been vigorously conducted to enhance performance and reliability of an LED package.

In general, an LED package can be manufactured by using a suitable LED chip and a resin encapsulant encapsulating the LED chip. For example, a blue LED chip mounted on the package body can be encapsulated by a molding resin having yellow phosphors dispersed therein to obtain a white LED package. At this time, the blue LED chip emits light with a wavelength of 460 nm and the yellow phosphors in the molding resin emit light with a wavelength of 545 nm. Combination of these light with such two wavelengths produces white light.

FIG. 1 is a view illustrating a process of manufacturing a conventional LED package.

Referring to FIG. 1, in the conventional LED package, to form a phosphor layer 13 encapsulating an LED chip 12 mounted on a substrate 11, a molding resin containing phosphors converting a wavelength of light from the LED chip 12 is applied on the LED chip 12 using a dispenser. Here, the molding resin applied may only partially encapsulate the LED chip 12, or flow down from a top surface of the LED chip 12 depending on viscosity thereof, thereby hampering uniform encapsulation of the LED chip 12.

SUMMARY OF THE INVENTION

An aspect of the present invention provides a light emitting diode (LED) package in which a phosphor layer encapsulating an LED chip is formed uniformly to facilitate a process.

According to an aspect of the present invention, there is provided an LED package including: a package body having a mounting area; a holding part mounted on the mounting area, the holding part being open to expose a portion of the mounting area; an LED chip mounted on the mounting area, the LED chip surrounded by the holding part to emit light; and a phosphor layer held by the holding part to seal a space defined by the holding part, the phosphor layer converting a wavelength of the light from the LED chip.

The holding part may be formed of a transparent material transmitting the wavelength-converted light.

The LED package may further include a lens focusing the wavelength-converted light.

The phosphor layer may have a refractivity greater than or equal to a refractivity of the holding part, and the holding part has the refractivity greater than or equal to a refractivity of the lens.

A protrusion may be formed on an inner circumferential surface of the holding part surrounding the holding part, and a transparent resin is formed between the phosphor layer and the LED chip, the transparent resin encapsulating the LED chip to prevent oxidation between a phosphor of the phosphor layer and the LED chip.

A groove may be formed in the mounting area of the package body to secure the holding part.

The holding part may be made of transparent silicon and formed by dispensing.

The protrusion of the holding part may have a height greater than a height of the LED chip and smaller than a height of the holding part, and the transparent resin layer may be formed to have a height from the mounting area of the package body to the protrusion.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
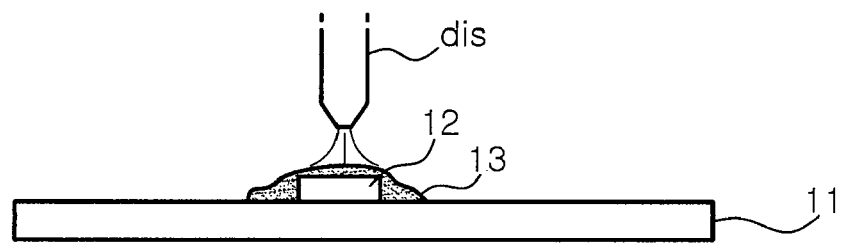
FIG. 1 is a view illustrating a process of manufacturing a conventional light emitting diode (LED) package.
Figure 2:
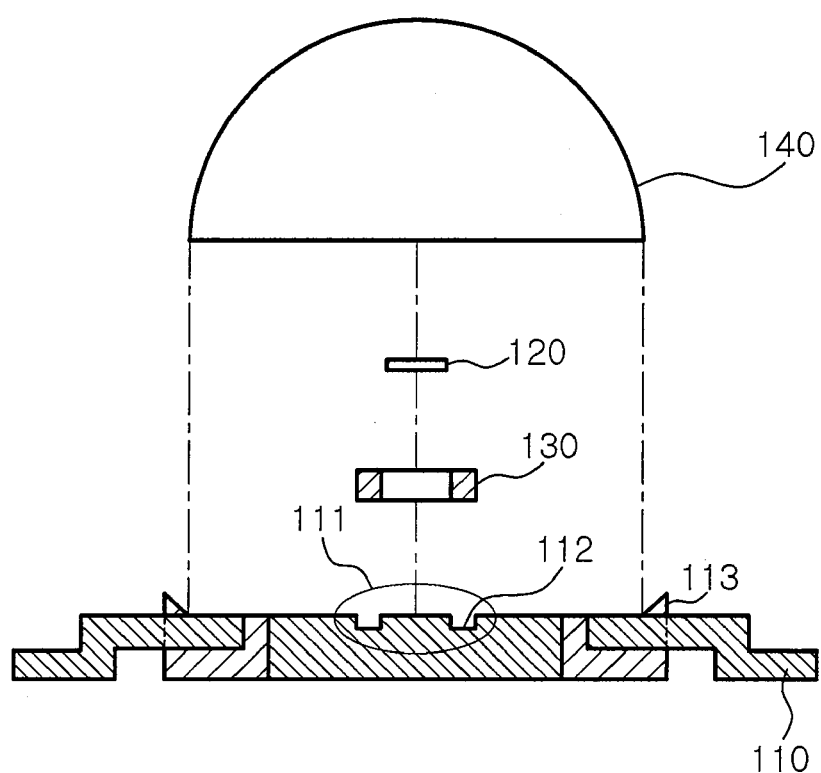
FIG. 2 is an exploded view illustrating an LED package according to an exemplary embodiment of the invention.

FIG. 2 is an exploded view illustrating an LED package according to an exemplary embodiment of the invention.

Referring to FIG. 2, the LED package 100 of the present embodiment includes a package body 110 having a mounting area 111.

An LED chip 120 is mounted on the mounting area 111 of the package body 110 to emit light of a predetermined wavelength.

A holding part 130 is mounted on the mounting area 111 of the package body 110 to surround the LED chip 120. The holding part 130 is opened at a top to emit light from the LED chip 120. The holding part 130 is formed of a transparent material to emit the light from the LED chip 120 therethrough.

Moreover, grooves 112 may be formed in the package body 110 to secure the holding part 130 thereto.

A lens 140 may be further mounted on the package body 110 to focus the light emitted. Also, a guide part 113 may be formed on the package body 110 to fix the lens 140 thereto.

Figure 3:
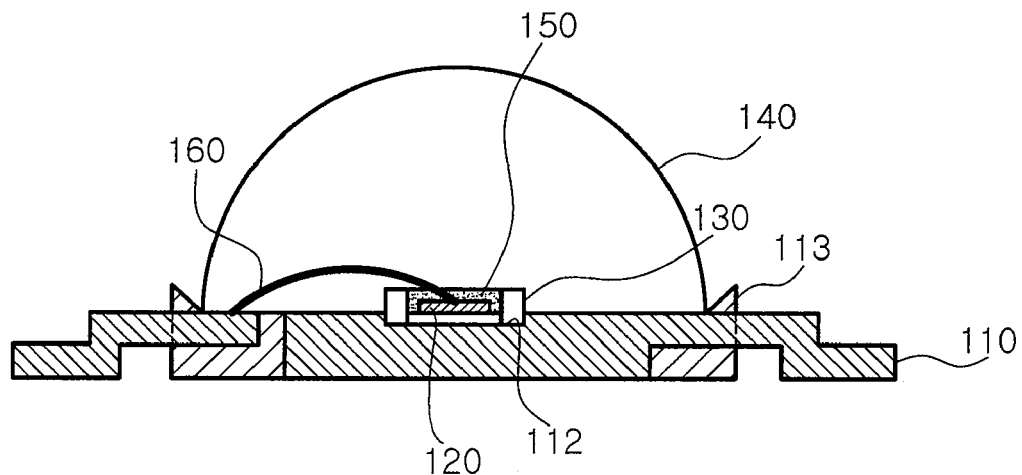
FIG. 3 is a cross-sectional view illustrating an LED package according to an exemplary embodiment of the invention.

FIG. 3 is a cross-sectional view illustrating an LED package according to an exemplary embodiment of the invention.

Referring to FIG. 3 together with FIG. 2, the LED package 100 includes a phosphor layer 150 encapsulating an LED chip 120. To form the phosphor layer 150, phosphors converting a wavelength of light from the LED chip 120 are contained in a silicon resin.

The phosphor layer 150 is formed on a space defined by the holding part 130 by dispensing. Accordingly, the holding part 130 allows the phosphor layer 150 to encapsulate the LED chip 120 uniformly.

Therefore, given that the light from the LED chip 120 is wavelength-converted by the phosphor layer 150 and focused by the lens 140 to be emitted, the phosphor layer 150 may have a refractivity greater than or equal to a refractivity of a holding part 130. Also, the holding part 130 may have the refractivity greater than or equal to a refractivity of the lens 140.

In addition, the LED package 100 may further include a bonding wire 160 connecting the LED chip 120 to an electrode of the package body.

Figure 4A:
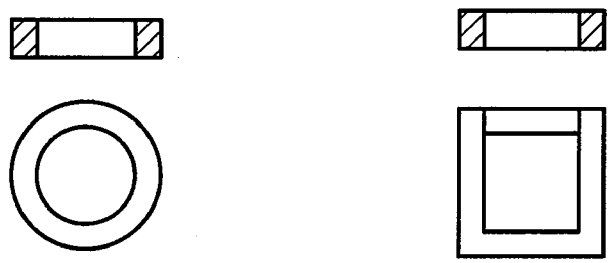
FIGS. 4A and 4B illustrate holding parts employed in an LED package according to an exemplary embodiment of the invention, respectively.
Figure 4B:

FIGS. 4A and 4B illustrate a holding part employed in an LED package according to an exemplary embodiment of the invention.

Referring to FIGS. 4A and 4B, the holding part employed in the LED package of the present embodiment may be configured variously. As shown in FIG. 4A, the holding part may be formed in the shape of circle or square along the LED chip to ensure uniform emission of the light.

Furthermore, referring to FIG. 4B, a protrusion may be formed on an inner circumferential surface of the holding part employed in the LED package of the present embodiment. This will be described in detail later with reference to FIG. 5B.

Figure 5A:
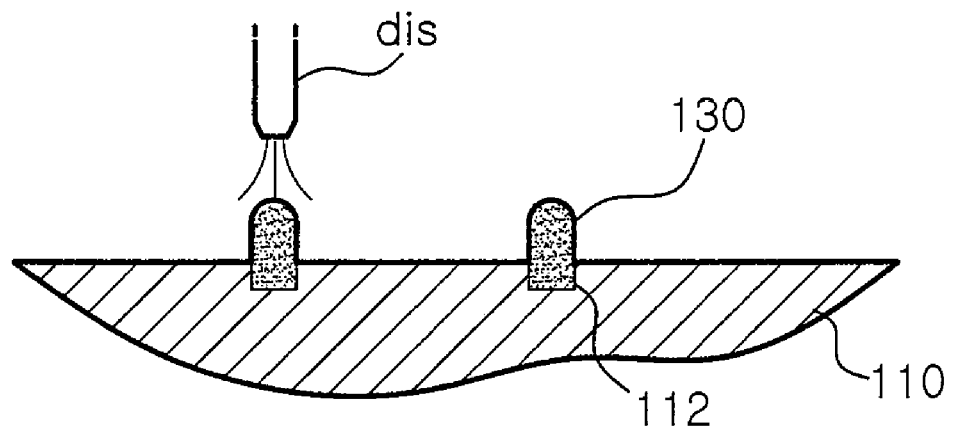
FIG. 5A is a view illustrating a process of manufacturing a holding part employed in an LED package according to an exemplary embodiment of the invention.
Figure 5B:
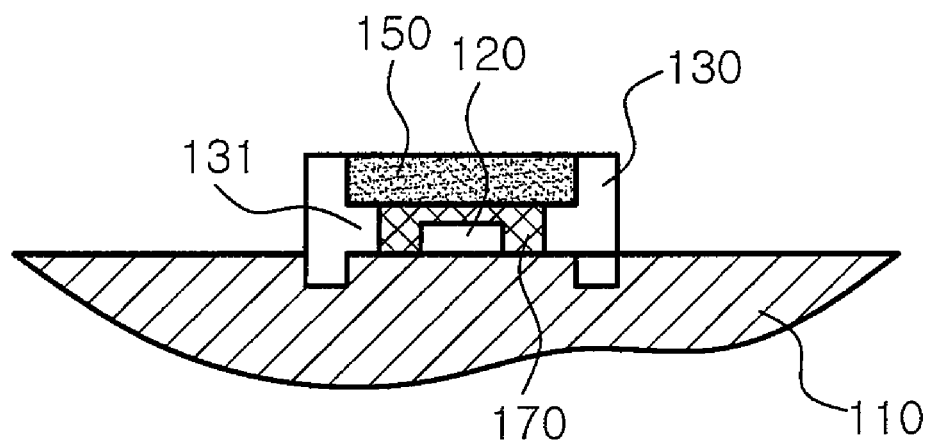
FIG. 5B is a view illustrating an LED package according to another exemplary embodiment of the invention.

FIG. 5A is a view illustrating a process of manufacturing a holding part employed in an LED package according to an exemplary embodiment of the invention. FIG. 5B is a view illustrating an LED package according to another exemplary embodiment of the invention.

Referring to FIG. 5A, the holding part 130 employed in the LED package of the present embodiment can be formed by a dispensing process utilizing a dispenser.

That is, the holding part 130 may be formed of a transparent silicon resin or a solid having a predetermined shape. As described above, the holding part 130 may be formed by using a dispenser. In order to facilitate a process, grooves 112 may be previously formed in a mounting area 111 of the package body 110 to enable the holding part 130 to surround the LED chip.

Referring to FIG. 5B, the holding part 130 employed in the LED package of the present embodiment has a protrusion 131 formed on an inner circumferential surface thereof.

Furthermore, a transparent resin layer 170 is formed between the phosphor layer 150 and the LED chip 120 in an area defined by the holding part 130 to surround the LED chip 120.

Phosphors contained in the phosphor layer 150 mainly adopt sulfide-based phosphors. These sulfide-based phosphors can oxidize a metal composition of the LED chip exposed outward. Also, an electrode may be formed on the mounting area 111 of the package body 110 to be electrically connected to the LED chip 120. The sulfide-based phosphors can chemically react with and oxidize the electrode.

A transparent resin layer 170 is formed between the phosphor layer 150 and the LED chip 120 and prevents oxidization of the outwardly exposed metal composition of the LED chip or the electrode that may be formed on the mounting area 111 of the package body 110.

The protrusion 131 of the holding part 130 may serve as a guideline for the transparent resin layer 170. That is, the protrusion 131 of the holding part 130 may have a height greater than a height of the LED chip 120 and the transparent resin layer 170 may be formed to a height of the protrusion 131 to facilitate the process.

As set forth above, according to exemplary embodiments of the invention, a holding part is formed to hold a phosphor layer encapsulating a light emitting diode (LED) chip, thereby easily ensuring that the phosphor layer encapsulates the LED chip uniformly.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting diode package comprising:
    a package body having a mounting area;
    a light emitting diode chip mounted on the mounting area and emitting light;
    a groove formed on the mounting area around the light emitting diode chip and surrounding the light emitting diode chip;
    a holding part mounted on the mounting area and fixed in the groove, the holding part surrounding the light emitting diode chip and being open to expose a portion of the mounting area and the light emitting diode chip disposed in the holding part; and
    a phosphor layer held by the holding part to seal a space defined by the holding part, the phosphor layer converting a wavelength of the light from the light emitting diode chip.

2. The light emitting diode package of claim 1, wherein the holding part is formed of a transparent material transmitting the wavelength-converted light.

3. The light emitting diode package of claim 2, wherein the light emitting diode package further comprises a lens focusing the wavelength-converted light.

4. The light emitting diode package of claim 3, wherein the phosphor layer has a refractivity greater than or equal to a refractivity of the holding part, and
    the holding part has the refractivity greater than or equal to a refractivity of the lens.

5. The light emitting diode package of claim 4, wherein a protrusion is formed on an inner circumferential surface of the holding part surrounding the holding part, and
    a transparent resin is formed between the phosphor layer and the light emitting diode chip, the transparent resin encapsulating the light emitting diode chip to prevent oxidation between a phosphor of the phosphor layer and the light emitting diode chip.

6. The light emitting diode package of claim 1, wherein the groove is formed on the mounting area of the package body to secure the holding part insertedly fitted in the groove.

7. The light emitting diode package of claim 6, wherein the holding part comprises transparent silicon dispensed from a dispenser.

8. The light emitting diode package of claim 5, wherein the protrusion of the holding part has a height greater than a height of the light emitting diode chip and smaller than a height of the holding part, and
    the transparent resin layer is formed to have a height from the mounting area of the package body to the protrusion.

* * * * *